United States Patent [19]
Kim

[11] Patent Number: 5,923,595
[45] Date of Patent: Jul. 13, 1999

[54] SYNCHRONOUS DRAM INCLUDING AN OUTPUT DATA LATCH CIRCUIT BEING CONTROLLED BY BURST ADDRESS

[75] Inventor: Hong Seok Kim, Ichon-shi, Rep. of Korea

[73] Assignee: Hyundai Electronice Industries Co., Ltd., Ichon-shi, Rep. of Korea

[21] Appl. No.: 09/065,908

[22] Filed: Apr. 24, 1998

[30] Foreign Application Priority Data

Apr. 25, 1997 [KR] Rep. of Korea ................ 97-15593

[51] Int. Cl.⁶ ..................................... G11C 16/04
[52] U.S. Cl. .............................. 365/189.05; 365/233
[58] Field of Search ................. 365/189.05, 189.12, 365/233, 233.5

[56] References Cited

U.S. PATENT DOCUMENTS

| | | | |
|---|---|---|---|
| 5,327,390 | 7/1994 | Takasugi | 365/230 |
| 5,526,320 | 6/1996 | Zagar et al. | 365/233.5 |
| 5,600,605 | 2/1997 | Schaefer | 365/233 |
| 5,610,864 | 3/1997 | Manning | 365/193 |
| 5,652,724 | 7/1997 | Manning | 365/189.05 |
| 5,673,233 | 9/1997 | Wright et al. | 365/233 |
| 5,675,549 | 10/1997 | Ong et al. | 365/233.5 |
| 5,703,830 | 12/1997 | Yasuhiro | 365/233 |
| 5,729,503 | 3/1998 | Manning | 365/233.5 |
| 5,850,368 | 12/1998 | Ong et al. | 365/238.5 |

*Primary Examiner*—David Nelms
*Assistant Examiner*—Anh Phung
*Attorney, Agent, or Firm*—Thelen Reid & Priest LLP

[57] ABSTRACT

A synchronous DRAM for high-speed operation does not apply a burst address to a column address buffer under SDRAM's burst mode operation which receives only an initial address from an external part and produces a next address within a chip, but does reduce a signal path of the SDRAM by directly applying the burst address to a register storing the prefetched data, thereby enhancing operation speed. The SDRAM for high-speed operation includes: a mode register for programming a burst length; a column address buffer and latch means controlling an operation of the column decoder by a column active signal; a burst length counter means which generates a burst address as long as a programmed burst length to the mode register after receiving a burst start address; a burst control means for controlling the burst length counter means; and data latch means which temporarily stores the data transmitted to the global I/O line, and transmits the stored data to the data output buffer by controlling the burst address.

4 Claims, 6 Drawing Sheets

SYNCHRONOUS DRAM INCLUDING AN OUTPUT DATA LATCH CIRCUIT BEING CONTROLLED BY BURST ADDRESS

BACKGROUND OF THE INVENTION

1. Field of the Invention

The present invention relates to a synchronous DRAM (hereinafter referred to as a SDRAM). More particularly, it relates to a SDRAM for high-speed operation which does not apply a burst address to a column address buffer under a burst mode operation of SDRAM, but which reduces a signal path of the SDRAM by directly applying the burst address to a register storing the prefetched data, thereby enhancing operation speed.

2. Description of the Prior Art

As for a read operation of a conventional SDRAM, if an address corresponding to a memory cell to be read is applied to the SDRAM, the address is input to a pre-decoder through an address buffer. At this time, an address transition detection circuit for detecting changes of the address generates one short pulse. In order to select a word line after a pre-decoding operation, the address operates a word line driver after passing through a row-decoder and then selects the word line. Similarly, if a column line corresponding to the selected memory cell is selected, the memory cell is selected. The data of the selected memory cell is input to a sense-amplifier via a bit line. The data amplified in the sense-amplifier is input to an output terminal through an output buffer.

As for a write operation of the conventional SDRAM, the process for selecting a memory cell is identical with the above read operation. During the write operation, the sense-amplifier and the output buffer have no function because a chip is at a write state, and a data input buffer enters in an operation state. Accordingly, the data being input to the input/output (I/O) pad is transmitted to a data bit line, and the data on the selected data bit line is input to a selected memory cell, thereby completing the write operation.

FIG. 1 is a block diagram of a conventional SDRAM. As shown in FIG. 1, the conventional SDRAM includes a burst length counter 18, a column address buffer/latch 19, column decoders 30 and 31, sense-amplifier & I/O gates 29 and 32, cell array blocks 23 and 24, data ouput buffers 25 and 26, a mode register 20, DQM controller 27 and DQ pin 28, etc. In operation, a counter starts operating when a burst address is input to the burst length counter 18, a pulse signal as long as the burst length is generated and input to the column address buffer/latch 19, thereby making a column path which passes through the column address buffer/latch 19, a column address predecoder and column decoders 30 and 31.

The afore-mentioned conventional SDRAM constructs a pipe line for a data bus sense-amplifier or a read data bus line, thereby enhancing operation speed. However, the burst address path becomes longer in this case, thereby causing a timing mismatch and a signal racing problem. Therefore, it is very difficult to design and verify a memory element, and such memory element needs requires a lot of time to develop itself.

SUMMARY OF THE INVENTION

Accordingly, the present invention is directed to a SDRAM for a high-speed operation that substantially obviates one or more of the problems which arise due to limitations and disadvantages of the related art.

It is an objective of the present invention to provide a SDRAM for a high-speed operation which does not apply a burst address to a column address buffer under a burst mode operation of SDRAM, but which does reduce a signal path of the SDRAM by directly applying the burst address to a register storing the prefetched data, thereby enhancing operation speed.

To achieve the above objective, in a SDRAM of a semiconductor memory element which comprises: a plurality of memory cell arrays which are made of a plurality of cells for being selected by an address and storing data, rows and columns; a plurality of row and column decoders for selecting the rows and the columns; a bit line sense-amplifier and a data bus line sense-amplifier which amplify a cell data selected by the address after the cell data is sequentially loaded on a bit line and a data bus line during a read operation; a data output buffer which performs a buffering operation on the data of the data bus line and outputs a result to the outside after the data of the data bus line is transmitted to a global Input/Output (GIO) line, a SDRAM for a high-speed operation includes:

a mode register for programming a burst length;

a column address buffer and latch means controlling the operation of the column decoder by a column active signal;

a burst length counter means which generates a burst address as long as a programmed burst length to the mode register after receiving a burst start address;

a burst control means for controlling the burst length counter means; and data latch means which temporarily stores the data transmitted to the global I/O (GIO) line, and transmits the stored data to the data output buffer by controlling the burst address.

Additional features and advantages of the invention will be set forth in the description which follows, and in part will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

Figure 2:
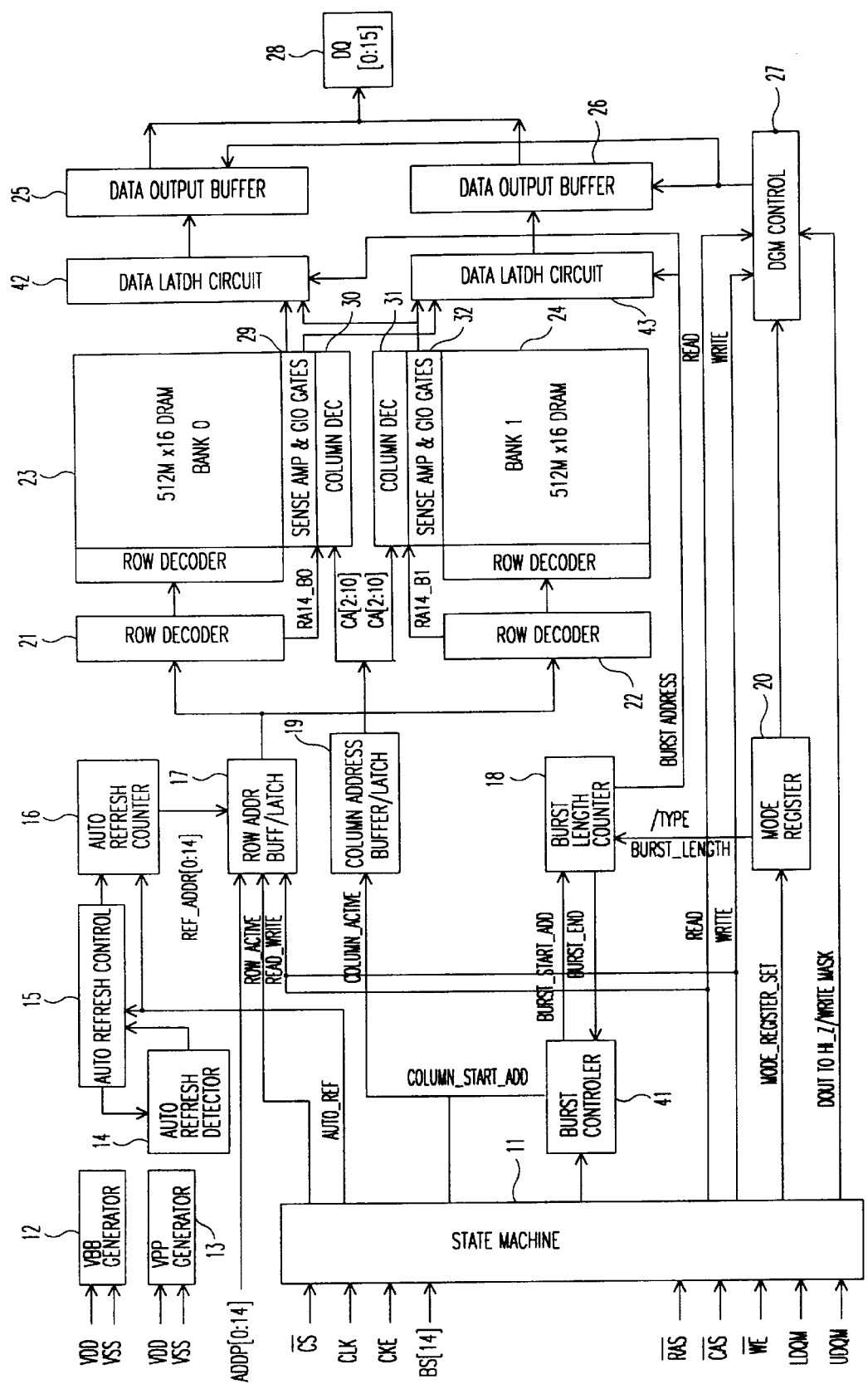
FIG. 2 is a block diagram of a SDRAM in accordance with a first preferred embodiment of the present invention.
Figure 3:
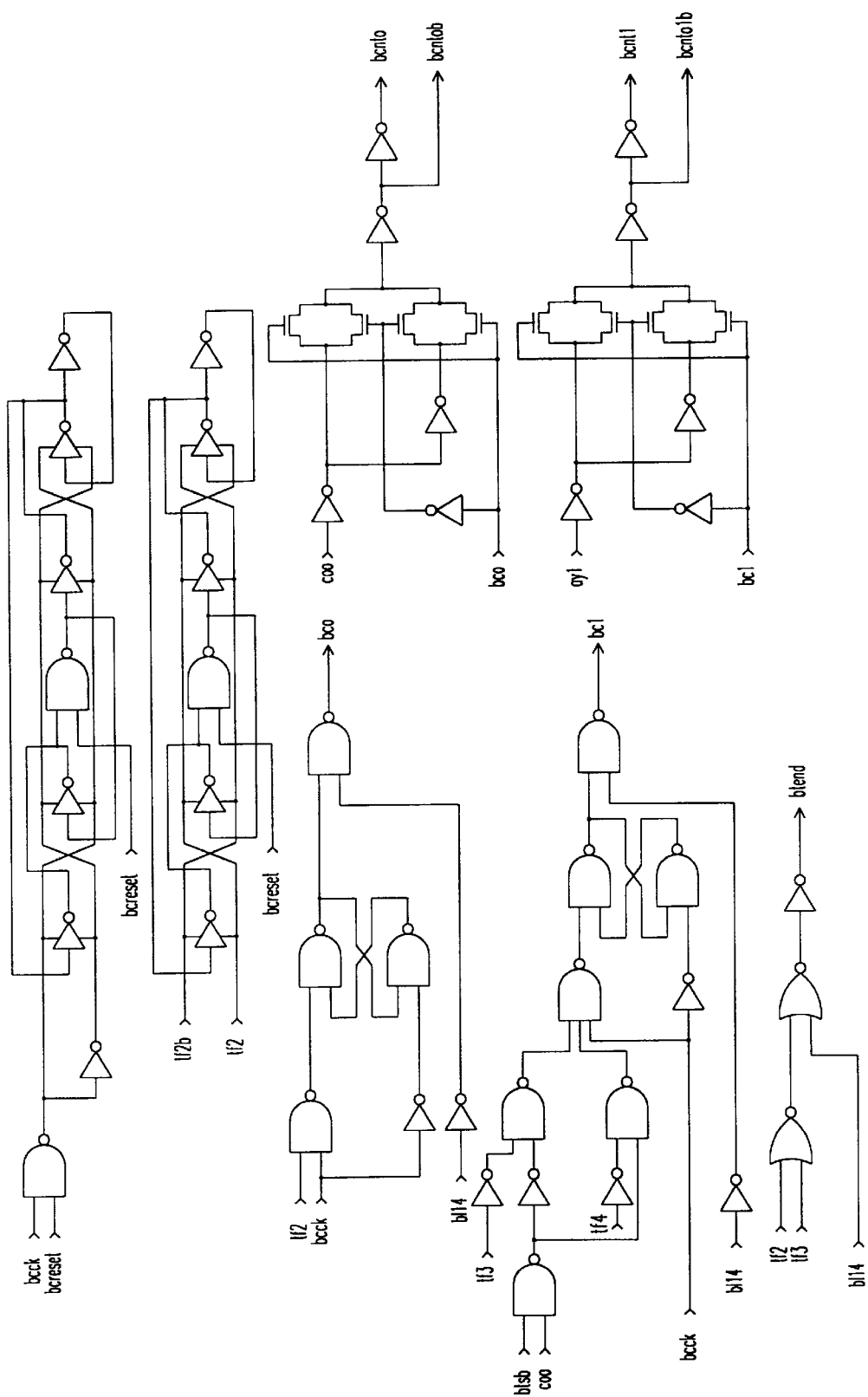
FIG. 3 is a detailed circuit diagram in accordance with a first preferred embodiment of a burst length counter circuit shown in FIG. 2.
Figure 4:
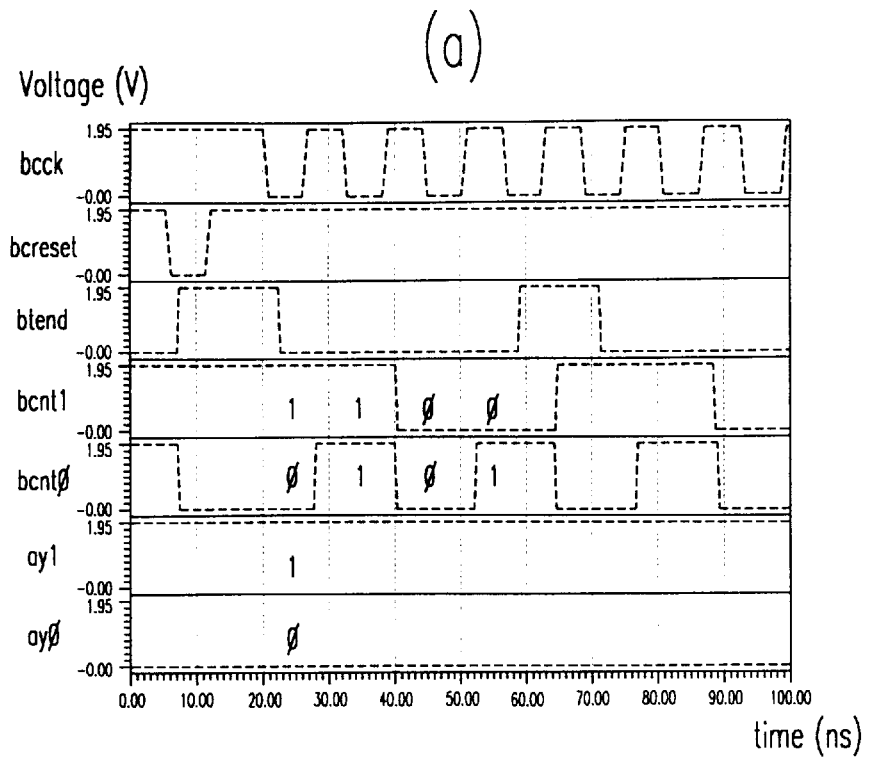
Figure 4:
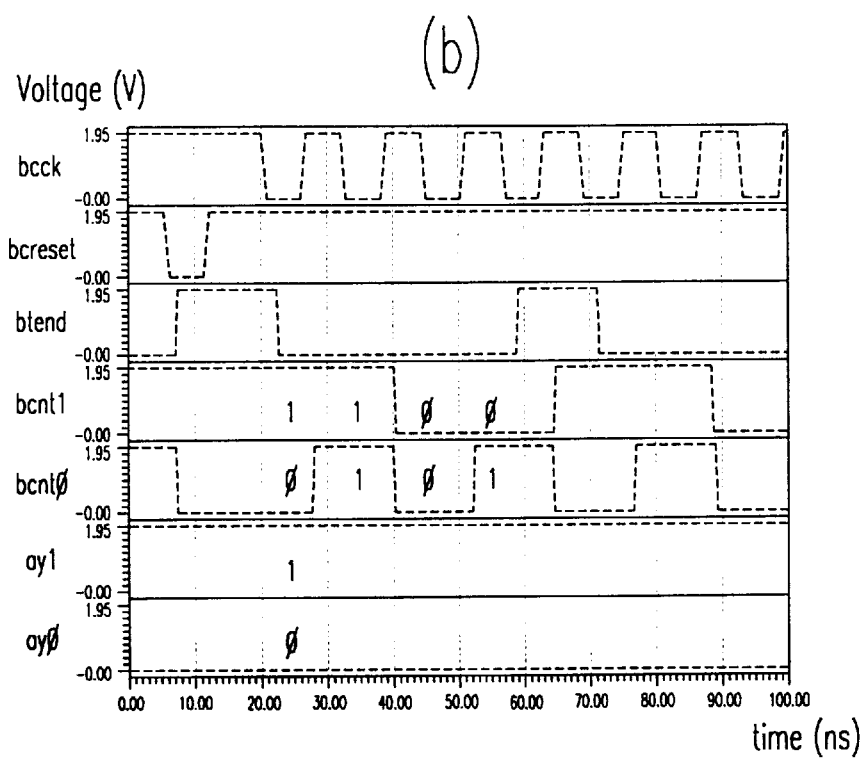
Figure 5:
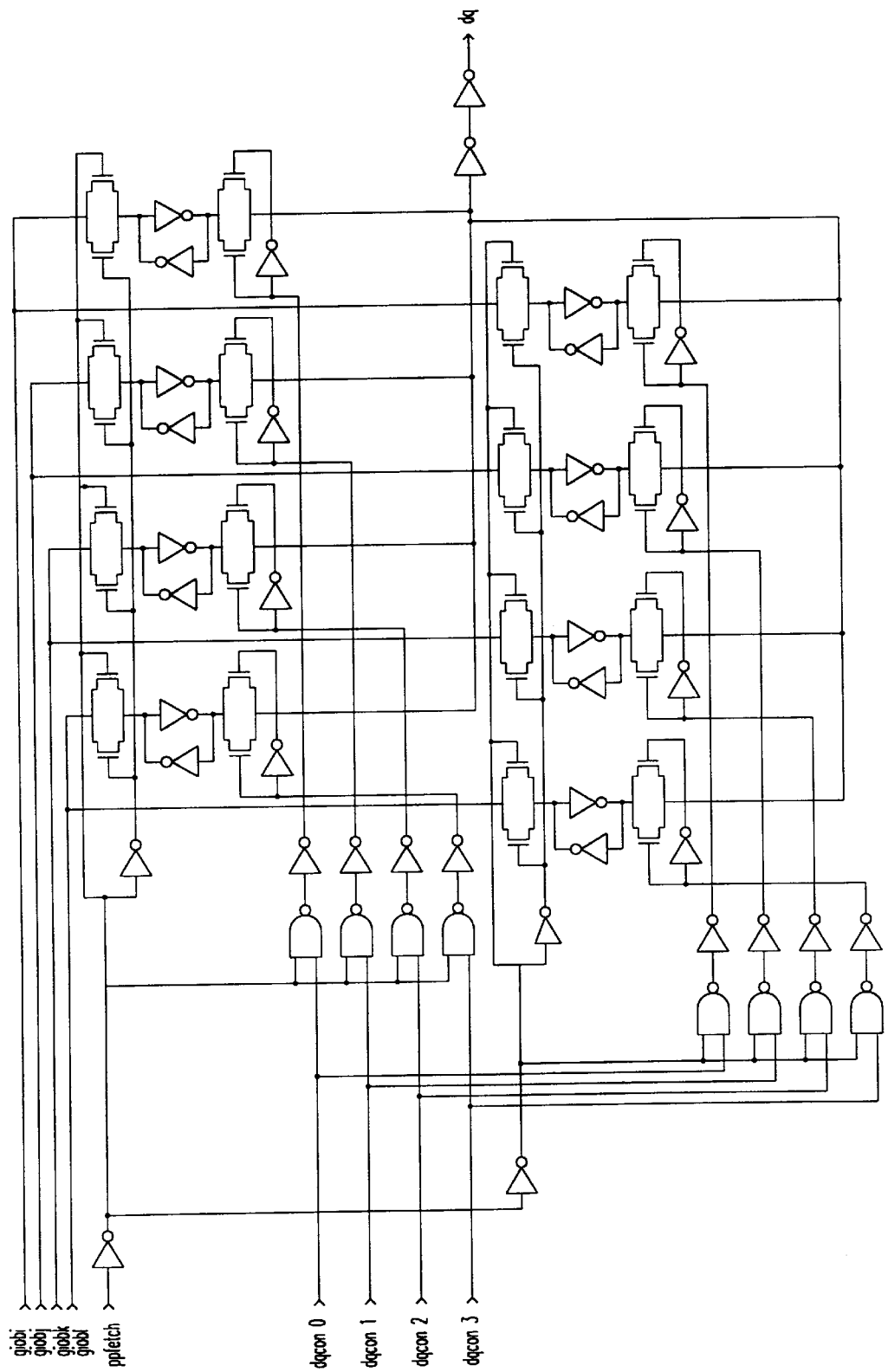
Figure 6:
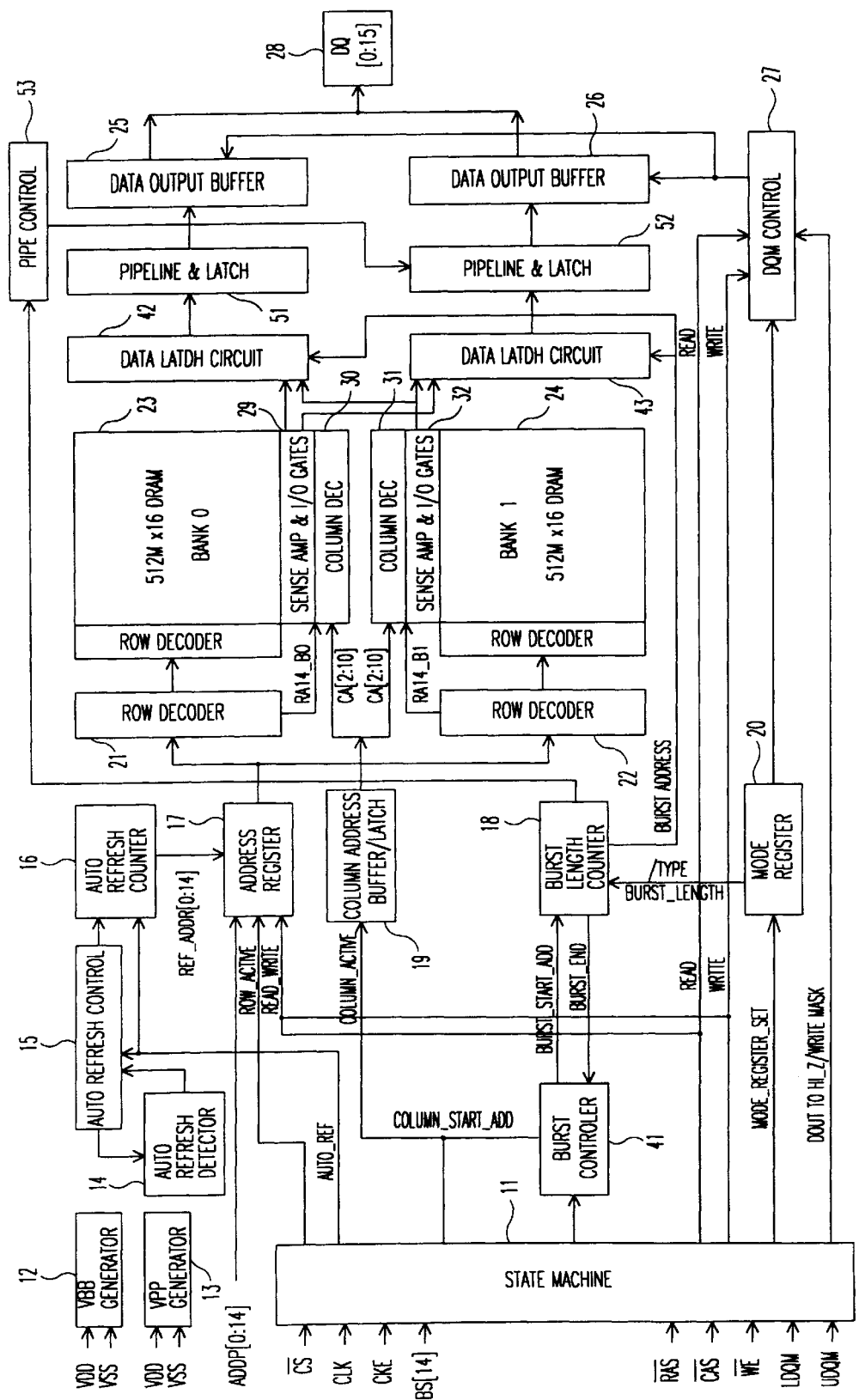

FIGS. 4A and 4B together present operation timing diagram of the burst length counter circuit shown in FIG. 3;

FIG. 5 is a detailed circuit diagram in accordance with a first preferred embodiment of data latch circuits shown in FIG. 2; and FIG. 6 is a block diagram of a SDRAM in accordance with a second preferred embodiment of the present invention.

DETAILED DESCRIPTION OF THE PREFERRED EMBODIMENTS

Reference will now be made in detail to the preferred embodiments of the present invention, examples of which are illustrated in the accompanying drawings.

FIG. 2 is a block diagram of a SDRAM in accordance with a first preferred embodiment of the present invention.

The SDRAM shown in FIG. 2 includes: a mode register 20 for programming a burst length; a column address buffer/latch 19 controlling the operation of the column decoder by a column active signal; a burst length counter 18 which generates a burst address as long as a programmed burst length to the mode register after receiving a burst start address; a burst controller 41 for controlling the burst length counter 18; and data latch circuits 42 and 43 which temporarily store data transmitted to a global I/O (GIO) line, and transmit the stored data to a data output buffer by controlling the burst address.

In operation, if the burst start address is input to the column address buffer/latch 19, the burst length counter 18 generates a corresponding burst address by receiving a control signal from the burst controller 41. A cell data generated from a bit line sense-amplifier and a data bus line sense-amplifier is transmitted to a global I/O (GIO) line, and is prefetched in the data latch circuits 42 and 43. At this time, the prefetched data is controlled by the burst address generated from the burst length counter 18, and is output to the data output buffers 25 and 26. The amount of data being prefetched by the data latch circuits 42 and 43 corresponds to a burst length of SDRAM. This data is prefetched by the burst length of SDRAM. For example, assuming that all registers of SDRAM are programmed as a burst length "8", the number of the global I/O (GIO) lines is 8 and a 8-bit prefetch data latch is needed.

Figure 1:
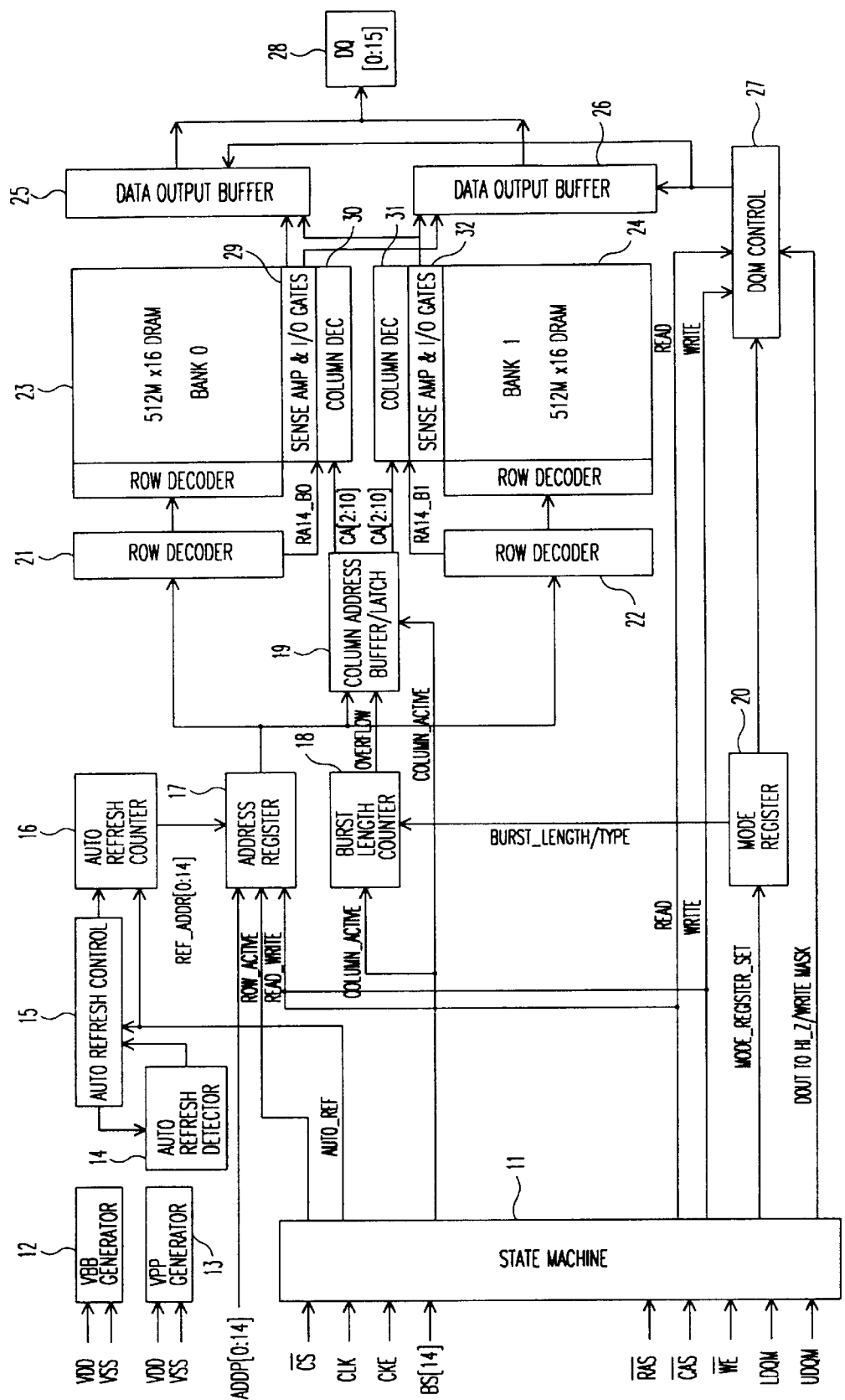
FIG. 1 is a block diagram of a conventional SDRAM.

If the burst address is applied to the data latch circuits 42 and 43, it is possible to construct a SDRAM on only a data output path in a different way from the conventional SDRAM shown in FIG. 1. Accordingly, the preferred embodiment according to the present invention is applicable to a general DRAM, and performs asynchronous behavior before a data output operation, so that it is rare that a signal racing problem and a timing mismatch would be generated in this preferred embodiment.

FIG. 3 is a detailed circuit diagram in accordance with a first preferred embodiment of a burst length counter circuit 18 shown in FIG. 2; and FIGS. 4A and 4B together present operation timing diagram of the burst length counter circuit 18 shown in FIG. 3. FIG. 4A depicts a case illustrating a sequence type of a burst length "4"; and FIG. 4B depicts another case illustrating a linear type of a burst length "4". As shown in FIGS. 4A and 4B, a changing sequence is 10→11→00→01.

The present invention prefetches memory cell data within a data latch circuit via the global I/O (GIO) line. As a result, speed of the column path increases in accordance with the number of the prefetched bits. For example, assuming that a burst length is "8" and the number of the GIO lines is "8", operation speed from a column buffer to the GIO line becomes octupled.

FIG. 5 is a detailed circuit diagram in accordance with a first preferred embodiment of data latch circuits 42 and 43 shown in FIG. 2. In FIG. 5, 4-bit prefetch processing is performed where a burst length is "4" and GIO line is "4", and then a pipe line processing occurs with this prefetched data. Herein, a mark "dq" is an output data going to a data output buffer, a mark "ppfetch" is a signal for selecting a pipe line circuit's output, marks "gioi", "gioj", "giok" and "giol" are global I/O (GIO) lines, and marks "dqcon0", "dqcon1", "dqcon2", and "dqcon3" output an address selected by the burst address to the output data "dq" via a latch circuit.

FIG. 6 is a block diagram of a SDRAM in accordance with a second preferred embodiment of the present invention, in which data latch circuits 42, 43, 51 and 52 are constructed in parallel. The data latch circuits 42, 43, 51 and 52 read in parallel the output signals of the data bus lines by N-bit, sequentially latch them to N data latch circuits, and sequentially read them by N at one time by the burst address. Each data latch circuit is constructed as a latch circuit whose number equals the number of GIO lines, and has both a pipe line structure and a prefetch structure.

The SDRAM shown in FIG. 6 reads the data bus line's output data by N-bit, sequentially latches the data to N data latch circuits, and then sequentially outputs the data by N at one time from the data latch circuits by the burst address. In this case, a circuit having a single-stage pipe line structure at 4-bit prefetch way is attained. Since the SDRAM inputs in parallel the data to a 4-bit prefetch stage, its operation speed is quadruple that of a general SDRAM, and its operation speed is doubled in a single-stage pipe line circuit. As a result, the data output speed becomes octupled.

As described above, a SDRAM according to the present invention does not apply a burst address to a column address buffer under a burst mode operation of SDRAM, but reduces a signal path of the SDRAM by directly applying the burst address to a register storing the prefetched data, thereby enhancing operation speed.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A SDRAM of a semiconductor memory element which comprises: a plurality of memory cell arrays which are made of a plurality of cells being selected by an address and storing data, rows and columns; a plurality of row and column decoders for selecting the rows and the columns; a bit line sense-amplifier and a data bus line sense-amplifier which amplify a cell data selected by the address after the cell data is sequentially loaded on a bit line and a data bus line during a read operation; a data output buffer which performs a buffering operation with the data of the data bus line and outputs a result to the outside after the data of the data bus line is transmitted to a global Input/Output (GIO) line, further comprising:

a mode register for programming a burst length;

a column address buffer and latch means controlling the operation of the column decoder by a column active signal;

a burst length counter means which generates a burst address as long as a programmed burst length to the mode register after receiving a burst start address;

a burst control means for controlling the burst length counter means; and a data latch means which temporarily stores the data transmitted to the global I/O line, and transmits the stored data to the data output buffer by controlling the burst address.

2. The SDRAM for a high-speed operation as set forth in claim 1, wherein the data latch means is constructed as latch circuits whose number equals the number of the global input/output (GIO) lines.

3. The SDRAM as set forth in claim 2, wherein the data latch means has a pipe line structure and a prefetch structure at a time.

4. The SDRAM as set forth in claim 2, wherein the data latch means reads in parallel an output signal of the data bus line by N-bit, sequentially latches it to N data latch circuits, and sequentially reads it by N at one time by the burst address.

* * * * *